(12) United States Patent
Kado et al.

(10) Patent No.: US 6,714,383 B2
(45) Date of Patent: Mar. 30, 2004

(54) MAGNETIC DISK APPARATUS

(75) Inventors: Yoshiyuki Kado, Ome (JP); Hiroshi Kikuchi, Hidaka (JP); Ikuo Yoshida, Musashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/740,957

(22) Filed: Dec. 21, 2000

(65) Prior Publication Data

US 2001/0005299 A1 Jun. 28, 2001

(30) Foreign Application Priority Data

Dec. 24, 1999 (JP) ........................................ 11-367862

(51) Int. Cl.$^7$ ............................. G11B 5/60; G11B 17/02
(52) U.S. Cl. ................................. 360/244.1; 360/264.2
(58) Field of Search .......................... 360/264.1, 264.2, 360/264.3, 244.1, 244.2, 244.3, 245.8, 245.9

(56) References Cited

U.S. PATENT DOCUMENTS

| | | | |
|---|---|---|---|
| 5,084,211 A | * | 1/1992 | Kawaguchi et al. ........ 252/511 |
| 5,245,489 A | * | 9/1993 | Kimura et al. .............. 360/104 |
| 5,583,720 A | * | 12/1996 | Ishida et al. ............. 360/97.01 |
| 5,936,304 A | * | 8/1999 | Lii et al. .................... 257/701 |
| 5,995,321 A | * | 11/1999 | Ishida ..................... 360/97.01 |
| 6,042,894 A | * | 3/2000 | Goto et al. ................. 427/504 |
| 6,134,084 A | * | 10/2000 | Ohwe et al. ............. 360/244.1 |
| 6,166,888 A | * | 12/2000 | Tsuda et al. ............. 360/264.2 |
| 6,268,980 B1 | * | 7/2001 | Shiraishi et al. ......... 360/234.5 |
| 6,282,062 B1 | * | 8/2001 | Shiraishi .................. 360/244.1 |
| 6,339,519 B1 | * | 1/2002 | Nomura et al. .......... 360/244.1 |
| 6,344,248 B1 | * | 2/2002 | Suga ........................... 428/1.5 |
| 6,369,985 B1 | * | 4/2002 | Gouo et al. .............. 360/244.1 |
| 6,437,944 B2 | * | 8/2002 | Ohwe et al. ............. 360/244.1 |
| 6,522,502 B1 | * | 2/2003 | Shiraishi et al. ......... 360/244.1 |

FOREIGN PATENT DOCUMENTS

| JP | 04047511 A | * | 2/1992 | ............ G11B/5/39 |
|---|---|---|---|---|
| JP | 11-195202 | | 7/1999 | |

OTHER PUBLICATIONS

Nikkei Electronics, Apr. 1998, vol. 6, No. 713, pp. 167–177.

* cited by examiner

Primary Examiner—Robert S. Tupper
(74) Attorney, Agent, or Firm—Mattingly, Stanger & Malur, P.C.

(57) ABSTRACT

A technique to be applied to improve the reliability of a magnetic disk apparatus is disclosed. In detail, a magnetic disk apparatus comprises a disk-shaped magnetic recording medium that rotates in operation, a magnetic head for writing the data in the magnetic recording medium and for reading out the data written in the magnetic recording medium, a carriage mechanism having an arm on which the magnetic head is located and moving the magnetic head to an arbitrary position on the magnetic recording medium, a wiring member having wiring, a semiconductor chip having a first main surface and a second main surface that are opposed to each other and electrodes formed on the first main surface, the semiconductor chip being fixed to the wiring member in the state that the electrodes are facing to the wiring of the wiring member, and a housing that contains the magnetic recording medium, the magnetic head, the carriage mechanism, the wiring member, and the semiconductor chip, wherein the edge of the first main surface side of the semiconductor chip and the edge of the second main surface side are covered with insulative resin.

22 Claims, 13 Drawing Sheets

MAGNETIC DISK APPARATUS

BACKGROUND OF THE INVENTION

This invention relates to a magnetic disk apparatus, and more particularly relates to a technique that is effectively applied to a magnetic disk apparatus having a semiconductor chip on an arm of a carriage mechanism.

A magnetic disk apparatus, which is to be incorporated in a personal computer or an electronic system of a network system server, mainly comprises a disk-shaped magnetic recording medium that is rotated at high speed by a spindle motor (referred to as magnetic disk hereinafter), a magnetic head for writing (recording) the data in a magnetic disk and for reading out (reproducing) the data written in a magnetic disk, a carriage mechanism for moving the magnetic head to an arbitrary position on a magnetic disk, a semiconductor chip (referred to as read/write semiconductor chip hereinafter) in which an amplifier circuit for amplifying the analog signal read out by means of the magnetic head, an A/D circuit for converting the analog signal that has been amplified by means of the amplifier circuit to the digital signal, and a control circuit or the like for controlling various signal are incorporated, and these components are contained in a single housing.

The carriage mechanism comprises an actuator and an arm for transmitting the power of the actuator to the magnetic head. The arm comprises a root part (carriage portion) fixed to a rotation shaft that is rotated by means of the actuator, an arm body portion that is continuous to the root part of the arm, and a suspension portion that is continuous to the arm body portion that has the magnetic head. The suspension portion usually comprises a separate parts different from the arm body portion, and is attached to the arm body portion by means of a fixing means.

The magnetic head comprises a writing head for writing the data in a magnetic disk, a reading head for reading out the data written in a magnetic disk, and a slider for generating the floating force by means of air flow due to rotation of a magnetic disk. The magnetic disk floats with a small distance from the recording surface of a magnetic disk by means of floating force due to the slider and deflection of the suspension portion of the arm, and the data is written or read out in this floating state.

Usually, the front side and back side of a magnetic disk that are opposed to each other are used as the recording surface for recording the data, and a plurality of magnetic disks are piled up with interposition of a predetermined space, a plurality of arms and magnetic heads corresponding to the number of recording surfaces are used.

In such a magnetic disk apparatus, the wire wiring in which wire is fixed along an arm has been employed as the connection means for electrical connection between a magnetic head and a read/write semiconductor chip. However, in order to enhance the productivity and realize the high data transfer speed, recently electrical connection between the magnetic head and the read/write semiconductor chip, in which wiring member formed by thin film forming technique is formed on an arm is employed as a trial. This technique is described in, for example, Nikkei Electronics, issued on April 1998, 6, (No. 713), pp. 167–177, by Nikkei BP.

A method is employed as a trial, in which a semiconductor chip (referred to as amplifier semiconductor chip hereinafter) containing a built-in amplifier circuit for amplifying the analog signal read out by means of a magnetic head and a built-in A/D conversion circuit for converting the analog signal amplified by means of the amplifier circuit to the digital signal is located on the suspension part of the arm or body part of the arm and a semiconductor chip (referred to as control semiconductor chip hereinafter) containing a built-in control circuit for controlling various signals is located on the root part of the arm. Such technique is described in, for example, Japanese Published Unexamined Patent Application No. Hei 11(1999)-195202 (published Jul. 21, 1999).

SUMMARY OF THE INVENTION

In this method in the case that an amplifier semiconductor chip is located on the suspension part of the arm or located on the arm body part, a method is employed generally, in which the semiconductor chip is fixed on the chip fixing area of the wiring member so that the back surface opposed to the circuit forming surface of the semiconductor chip is facing to the wiring member, thereafter an electrode (bonding pad) formed on the circuit forming surface of the semiconductor chip is electrically connected to the wiring of the wiring member by use of a bonding wire, and resin is coated on the semiconductor chip and bonding wire for covering to protect the circuit forming surface of the semiconductor chip and the bonding wire (simply referred to as face up method hereinafter).

However, in the case of the face up method, because the thickness of the resin coated on the circuit forming surface of the semiconductor chip is inevitably thick correspondingly to the loop height (height from the circuit forming surface of the semiconductor chip to the top in the perpendicular direction) of the bonding wire, it is required to widen the space between magnetic disks, and such structure brings about the difficulty in designing the thin magnetic disk apparatus. Furthermore, because the signal transmission path between the electrode of the semiconductor chip and the wiring of the wiring member is inevitably long, such structure also brings about the difficulty in designing the high rate data transfer.

A method (simply referred to as face down method hereinafter) described hereinafter may be effectively employed in the case that an amplifier semiconductor chip is located on the suspension part of an arm or on the arm body part, in which an electrode of the semiconductor chip is electrically connected to a wiring of a wiring member with a projection electrode interpolated between the electrode of the semiconductor chip and the wiring of the wiring member and resin is filled between the semiconductor chip and the wiring member for covering the circuit forming surface of the semiconductor chip and the projection electrode to protect the circuit forming surface and the projection electrode. In the case of the face down method, the height of the projection electrode offsets the thickness of the resin, the space between magnetic disks can be narrower than that in the case of the face up method, and the thickness of the magnetic disk apparatus can be smaller. Furthermore, because the signal transmission path between the electrode of the semiconductor chip and the wiring of the wiring member is shorter in comparison with that in the case of the face up method, the higher data transfer rate can be realized.

However, the face down method is involved in a problem as described hereinafter. A semiconductor chip mainly comprises a semiconductor substrate formed of, for example, single crystal silicon. Such semiconductor chip is generally formed by means of a process in which a plurality of chip forming areas are formed on the circuit forming surface of a semiconductor wafer (semiconductor substrate) and the semiconductor wafer is diced, and the plurality of chip forming areas are divided into individual areas. Because a semiconductor substrate formed of single crystal silicon is hard and brittle, many small broken and cracks are formed on the edge portion of the circuit forming surface side (corner where the cut surface and the circuit forming surfaces intersect) and edge portion on the back side (corner where the cut surface and the back surface intersect) of the semiconductor chip divided by dicing. Because the broken and crack can cause fragments (silicon dust) separated from the semiconductor substrate, the semiconductor chip is apt to release debris.

In the case of the face down method, because the edge portion on the circuit forming surface side of the semiconductor chip is covered with resin filled between the semiconductor chip and the wiring member, the release of debris from the edge portion on the circuit forming surface side of the semiconductor chip is suppressed, however, because the back side of the semiconductor chip is exposed, debris is released from the edge portion on the back side of the semiconductor chip.

In the case that such debris remains on the recording surface of a magnetic disk, the debris is interposed between the recording surface of the magnetic disk and a magnetic head, the recording surface of the magnetic disk and the magnetic head are damaged or failure in writing of the data and reading out of the data is caused, and the reliability of the magnetic disk apparatus becomes seriously poor.

The failure due to debris of semiconductor chip is apt to arise in the case that a semiconductor chip is located on the suspension part of an arm and arm body part by means of the face down method. However also in the case of the face down method that a semiconductor chip is located on the root part of an arm and on the area other than the carriage mechanism, because a magnetic disk rotates at high speed in a closed housing and air flow due to rotation of the magnetic disk blows off debris on the area other than that of the magnetic disk and the debris falls down on the recording surface of the magnetic disk, the debris causes the failure.

Furthermore, recently, it is the trend that the areal recording density is increased to increase the recording capacity (number of bits recordable per one inch square). The increase in the areal recording density inevitably reduces the area of a magnetic pattern for one bit, and the magnetic force is weak and it becomes difficult to read out the data. To solve such problem, the floating distance between the recording surface of a magnetic disk and a magnetic head is reduced to read the weak magnetic force easily. Therefore, the suppression of the release of debris from a semiconductor chip is important for the magnetic disk apparatus.

It is an object of the present invention to provide a technique to improve the reliability of a magnetic disk apparatus.

The above-mentioned and other objects and features of the present invention will be apparent from the description of the present specification and with reference to the attached drawings.

The summary of the representative inventions will be described hereinafter out of inventions disclosed in the present patent application.

(1) A magnetic disk apparatus comprises;

a disk-shaped magnetic recording medium (magnetic disk) that rotates in operation, a magnetic head for writing the data in the magnetic recording medium and for reading out the data written in the magnetic recording medium, a carriage mechanism having an arm on which the magnetic head is located and moving the magnetic head to an arbitrary position on the magnetic recording medium, a wiring member having wiring, a semiconductor chip having a first main surface (circuit forming surface) and a second main surface (back surface) that are opposed to each other and electrodes formed on the first main surface, the semiconductor chip being fixed to the wiring member in the state that the electrodes are facing to the wiring of the wiring member, and a housing that contains the magnetic recording medium, the magnetic head, the carriage mechanism, the wiring member, and the semiconductor chip, wherein the edge of the first main surface side of the semiconductor chip and the edge of the second main surface side are covered with insulative resin.

(2) The side surface (dicing surface) of the semiconductor chip is covered with the resin in the magnetic disk apparatus described in the means (1).

(3) A magnetic disk apparatus comprises;

a disk-shaped magnetic recording medium that rotates in operation, a magnetic head for writing the data in the magnetic recording medium and for reading out the data written in the magnetic recording medium, a carriage mechanism having an arm on which the magnetic head is located and moving the magnetic head to an arbitrary position on the magnetic recording medium, a wiring member having wiring, a semiconductor chip having a first main surface and a second main surface that are opposed to each other and electrodes formed on the first main surface, the semiconductor chip being fixed to the wiring member in the state that the electrodes are facing to the wiring of the wiring member, and a housing that contains the magnetic recording medium, the magnetic head, the carriage mechanism, the wiring member, and the semiconductor chip, wherein;
 the electrode of the semiconductor chip is electrically connected to the wiring of the wiring member with interposition of a projection electrode,
 the edge of the first main surface side of the semiconductor chip is covered with resin filled between the first main surface of the semiconductor chip and the wiring member, and
 the edge of the second main surface side of the semiconductor chip is covered with resin located so as to cover the second main surface of the semiconductor chip.

(4) A magnetic disk apparatus comprises;

a disk-shaped magnetic recording medium that rotates in operation, a magnetic head for writing the data in the magnetic recording medium and for reading out the data written in the magnetic recording medium, a carriage mechanism having an arm on which the magnetic head is located and moving the magnetic head to an arbitrary position on the magnetic recording medium, a wiring member having wiring, a semiconductor chip having a first main surface and a second main surface that are opposed to each other and electrodes formed on the first main surface, the semiconductor chip being fixed to the wiring member in the state that the electrodes are facing to the wiring of the wiring member, and a housing that contains the magnetic recording medium, the magnetic head, the carriage mechanism, the wiring member, and the semiconductor chip, wherein;
the semiconductor chip is adhered and fixed to the wiring member with interposition of anisotropically conductive resin containing much conductive particles mixed in insulative resin base material, the electrode of the semiconductor chip is electrically connected to the wiring of the wiring member with interposition of a projection electrode and conductive particles contained in the anisotropically conductive resin, the edge of the first main surface side of the semiconductor chip is covered with the anisotropically conductive resin, and the edge of the second main surface side of the semiconductor chip is covered with the resin located so as to cover the second main surface of the semiconductor chip.

(5) A magnetic disk apparatus comprises;

a disk-shaped magnetic recording medium that rotates in operation, a magnetic head for writing the data in the magnetic recording medium and for reading out the data written in the magnetic recording medium, a carriage mechanism having an arm on which the magnetic head is located and moving the magnetic head to an arbitrary position on the magnetic recording medium, a wiring member having wiring, a semiconductor chip having a first main surface and a second main surface that are opposed to each other and electrodes formed on the first main surface, the semiconductor chip being fixed to the wiring member in the state that the electrodes are facing to the wiring of the wiring member, and a housing that contains the magnetic recording medium, the magnetic head, the carriage mechanism, the wiring member, and the semiconductor chip, wherein;
the semiconductor chip is adhered and fixed to the wiring member with interposition of anisotropically conductive resin containing much conductive particles mixed in insulative resin base material, the electrode of the semiconductor chip is electrically connected to the wiring of the wiring member with interposition of conductive particles contained in the anisotropically conductive resin, the edge of the first main surface side of the semiconductor chip is covered with the anisotropically conductive resin, and the edge of the second main surface side of the semiconductor chip is covered with the resin located so as to cover the second main surface of the semiconductor chip.

According to the above-mentioned means, in the case of the divided semiconductor chip formed by dicing, though many small debris and cracks are formed on the edge portion of the first main surface side and the edge portion of the second main surface side, the forming of debris and cracks from the edge portion of the first main surface side of the semiconductor chip and the edge portion of the back surface side is suppressed because the edge portion of the first main surface side of the semiconductor chip and the edge portion of the second main surface side are covered with the resins. As the result, the failure that the recording surface of the magnetic recording medium and the magnetic head are damaged and the failure in writing of the data and reading out of the data, both failures are caused from the debris interposed between the recording surface of the magnetic recording medium and a magnetic head, are prevented. In addition, the failure that the recording surface of the magnetic recording medium and the magnetic head are damaged and the failure in writing of the data and reading out of the data, both failures being caused by the fact that the magnetic recording medium rotates at high speed in a closed housing, air flow due to rotation of the magnetic recording medium blows off debris on the area other than that of the magnetic recording medium, and the debris falls down on the recording surface of the magnetic recording medium whereby the debris is interposed between the recording surface of the recording medium and a magnetic head, are suppressed. As the result, the reliability of the magnetic disk apparatus is improved.

DETAILED DESCRIPTION OF THE PREFERRED EMBODIMENTS

Figure 1:
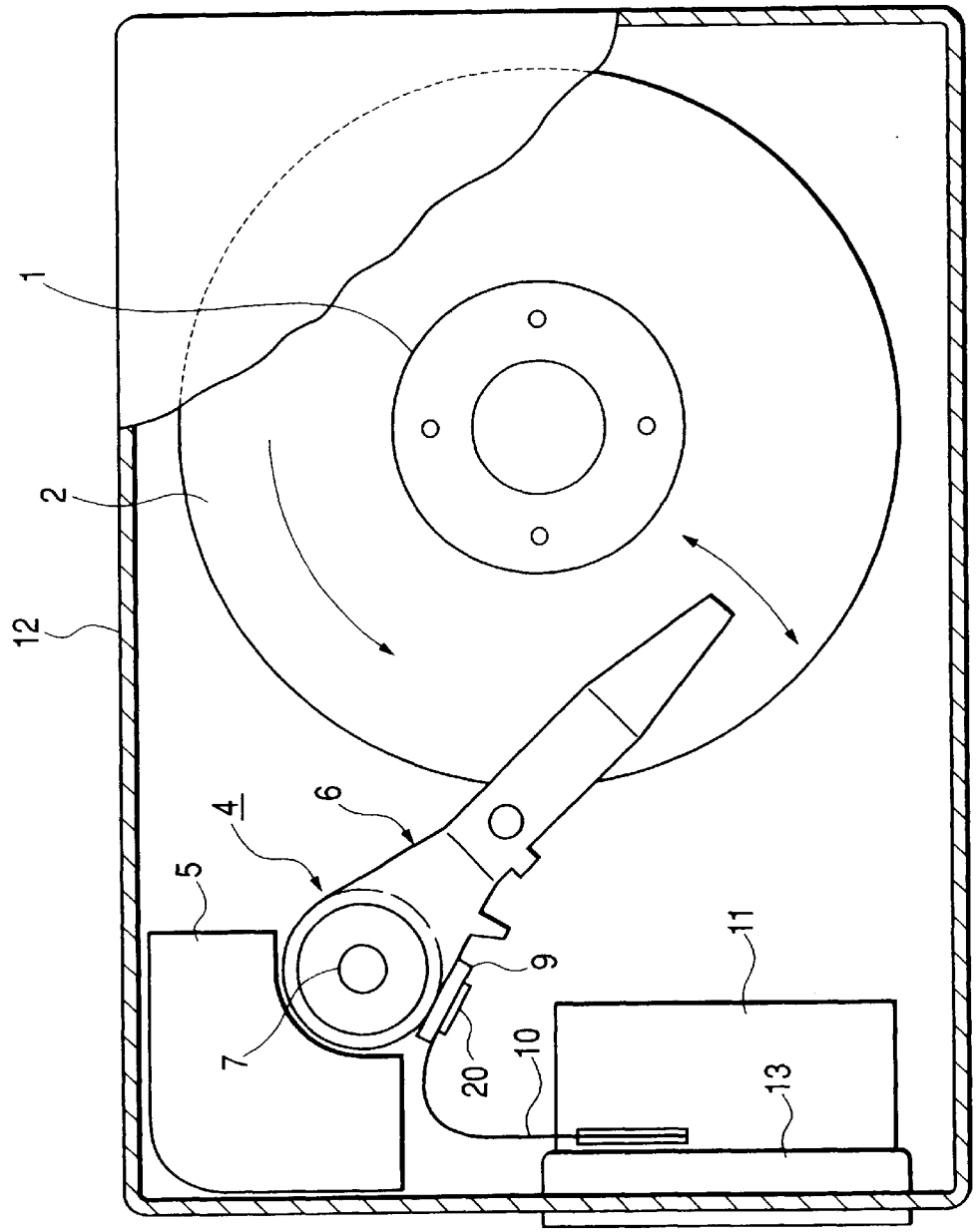
FIG. 1 is a schematic plan view illustrating the schematic structure of a magnetic disk apparatus in accordance with the embodiment 1 of the present invention.

The structure of the present invention will be described exemplarily referring to embodiments involving a magnetic disk apparatus that is incorporated in a server of a network system as a storage apparatus to which the present invention is applied. In the drawings for describing these embodiments, the same components having the same functions are given the same characters, and the repeated description is omitted.

Embodiment 1

Figure 2:
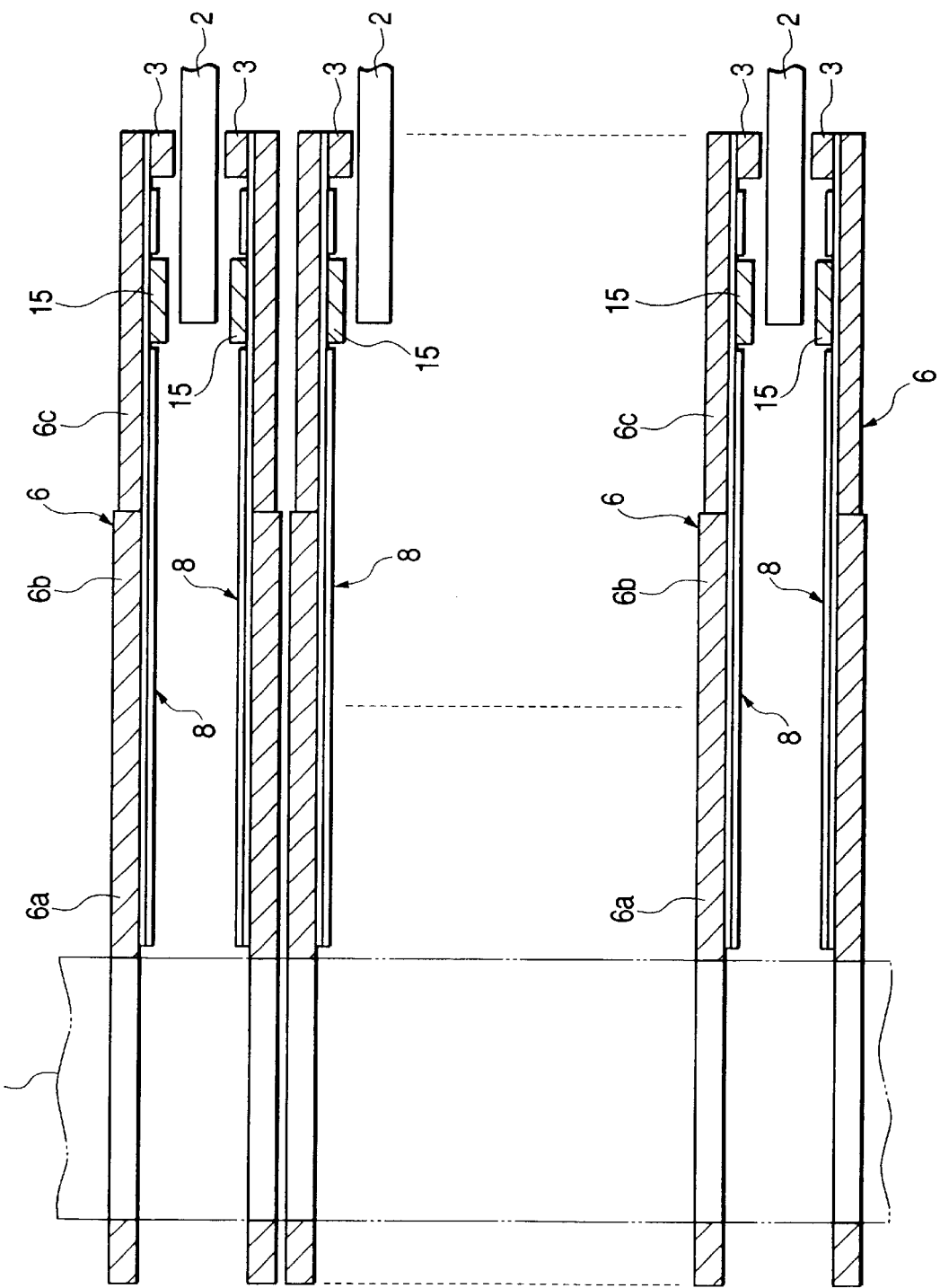
FIG. 2 is a schematic cross sectional view illustrating the schematic structure of a carriage mechanism incorporated in the above-mentioned magnetic disk apparatus.
Figure 3:
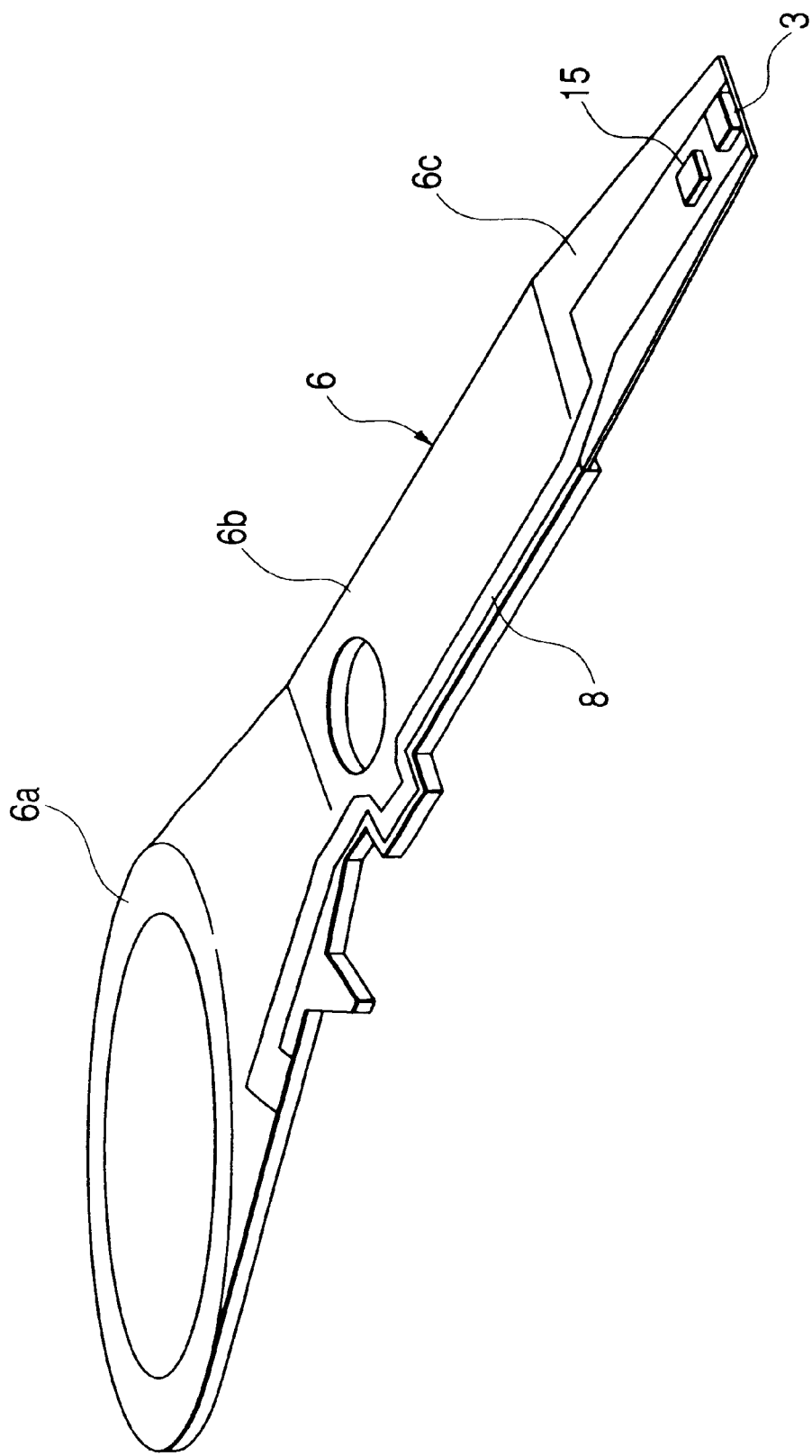
FIG. 3 is a schematic perspective view of an arm that constitutes the above-mentioned carriage mechanism.
Figure 4:
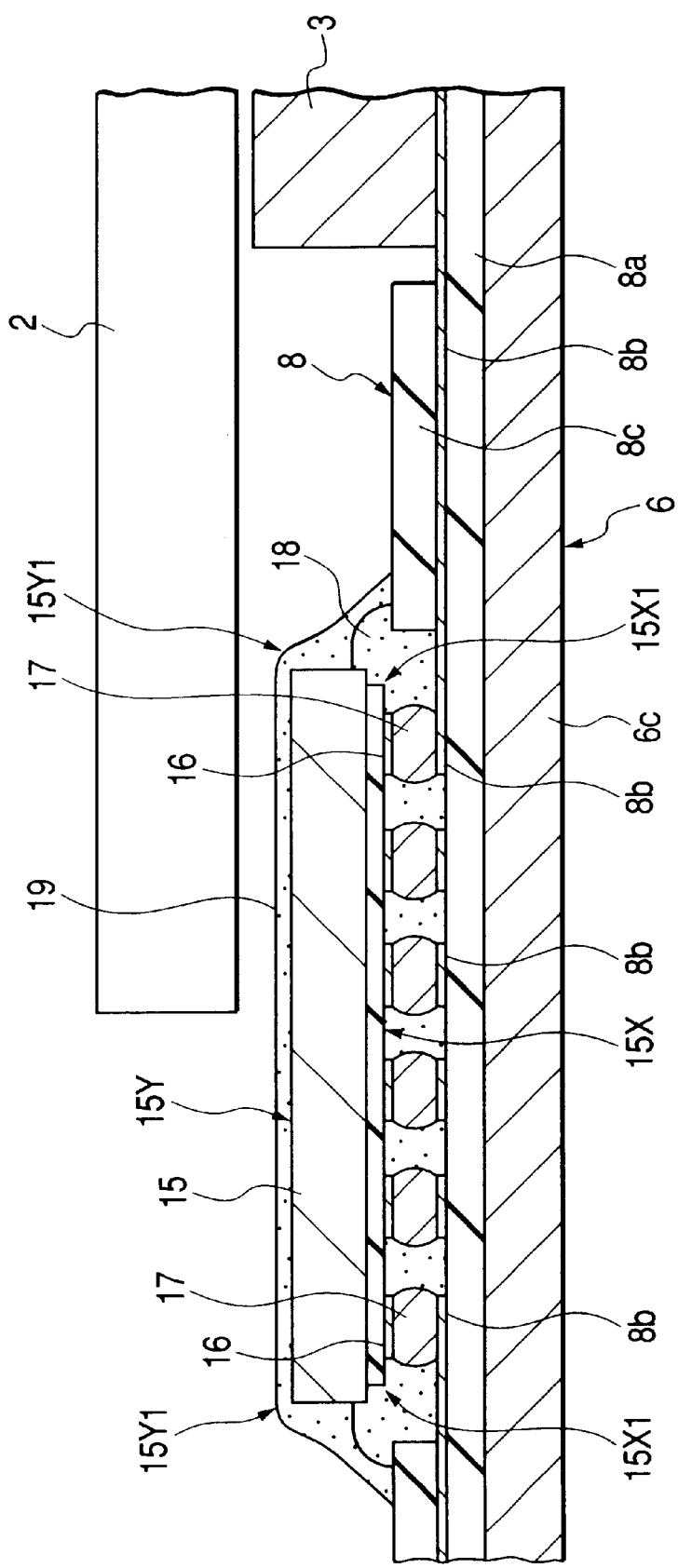
FIG. 4 is a partially enlarged schematic cross section view of FIG. 3.

FIG. 1 is a schematic cross sectional view illustrating the schematic structure of a magnetic disk apparatus in accordance with the embodiment 1 of the present invention, FIG. 2 is a schematic cross section view illustrating the schematic structure of a carriage mechanism incorporated in the above-mentioned magnetic disk apparatus, FIG. 3 is a schematic perspective view illustrating the schematic structure of an arm that constitutes the above-mentioned carriage mechanism, and FIG. 4 is a partially enlarged schematic cross sectional view of FIG. 3.

As shown in FIG. 1 and FIG. 2, the magnetic disk apparatus of the present embodiment mainly comprises a disk-shaped magnetic recording medium (referred to as magnetic disk hereinafter) 2 that is rotated at high speed by means of a spindle motor 1, a magnetic head 3 for writing (recording) the data in the magnetic disk 2 and for reading out (reproducing) the data written in the magnetic disk 2, a carriage mechanism 4 for moving the magnetic head 3 to an arbitrary position on the magnetic disk 2, a semiconductor chip 15 having a built-in amplifier circuit for amplifying the analog signal read out by means of the magnetic head 3 and a built-in A/D conversion circuit for converting the analog signal amplified by means of the amplifier circuit to the digital signal therein, a semiconductor chip 20 having a built-in control circuit for controlling various signal therein, a wiring member 8 for electrically connecting the magnetic head 3 to the semiconductor chip 15 and for electrically connecting the semiconductor chip 15 to the semiconductor chip 20, and a wiring member 10 for electrically connecting the semiconductor chip 20 to a wiring substrate 11. These components are contained in one housing 12.

The magnetic disk apparatus of the present embodiment is disposed from an inside to an outside of the housing 12, and has an external connection connector 13 electrically connected to the wiring substrate 11 in the structure. The housing 12 comprises several parts and fabricated so that the interior of the housing is sealed.

The carriage mechanism 4 comprises an actuator 5 and an arm 6 for transmitting the power of the actuator 5 to the magnetic head 3. For example, a stepping motor that is used for high speed accurate positioning is used as the actuator 5. The arm 6 fixed to a rotation shaft 7 that is rotated by means of the actuator 5 comprises a root part (carriage part) 6a to which the magnetic head moving force of the carriage mechanism 4 is transmitted, an arm body part 6b that is continuous to the root part 6a, and a suspension part 6c that is continuous to the arm body part 6b, and on which the magnetic head 3 is disposed. The suspension part 6c is formed of a parts different from the arm body part 6b, and attached to the arm body part 6b with a fixing means. In the present embodiment, the suspension part 6c is formed of a stainless steel parts having spring function.

The magnetic head 3 comprises a writing head for writing the data in a magnetic disk 2, a reading head for reading out the data written in a magnetic disk 2, and a slider for generating the floating force by means of air flow caused by rotating a magnetic disk 2. The magnetic head 3 floats with a small distance from the recording surface of a magnetic disk 2 by means of the floating force given by the slider and deflection of the suspension part 6c, and the magnetic head 3 writes/reads the data in this floating state. In the present embodiment, for example, a thin film head in which a current is supplied to a coil to generate a magnetic field is used as the writing head, and, for example, MR (Magneto Resistive) head in which the electrical resistivity is changed depending on the intensity of magnetic field is used as the reading head.

Because both front and back surfaces of a magnetic disk 2 that are opposed to each other are used as the recording surface for recording the data and a plurality of magnetic disks are placed one on another with a predetermined space, a plurality of arms 6 and magnetic heads 3 are provided correspondingly to the number of recording surfaces. In the present embodiment, because 15 magnetic disks are provided, 30 arms and 30 magnetic heads are provided.

As shown in FIG. 2 and FIG. 3, each arm 6 is provided with a wiring member 8 that extends from one end side of the arm 6 (end portion of the suspension part 6c) to the other end side (root part 6a). As shown in FIG. 4, the wiring member 8 comprises an insulation layer 8a, a wiring 8b formed on the insulation layer 8a, and an insulation layer 8c formed on the insulation layer 8a so as to cover the wiring 8b. The insulation layers 8a and 8c are formed of, for example, polyimide base resin, and the wiring 8b is formed of a conductive thin film layer formed by means of, for example, spattering.

The semiconductor chip 15 mainly comprises a semiconductor substrate formed of, for example, single crystal silicon, and a multi-layer wiring layer formed on the circuit forming surface of the semiconductor substrate. On a circuit forming surface 15X that is the front surface (first main surface) out of the front and back surfaces (the first main surface and second main surface that are opposed to each other) of a semiconductor chip 15, a plurality of electrodes 16 are formed.

Electrodes 16 formed on the circuit forming surface 15X of a semiconductor chip 15 are fixed on the chip location area of the wiring member 8 so as to face to wirings 8b of the wiring member 8. The electrodes 16 of the semiconductor chip 15 are connected to corresponding respective wirings 8b electrically and mechanically with interposition of projection electrodes 17. In other words, the semiconductor chip 15 of the present embodiment is mounted on the chip location area of the wiring member 8 by means of the face down method. In the present embodiment, the projection electrodes 17 are formed of metal material such as Pb—Sn composition alloy. Furthermore, the semiconductor chip 15 is located on the suspension part 6c of the arm 6 with interposition of the wiring member 8.

The magnetic head 3 is located on the end part of the suspension part 6c of the arm 6 with interposition of the wiring member 8. The magnetic head 3 is connected to the electrodes 16 electrically and mechanically with interposition of the wirings 8b of the wiring member 8. The magnetic head 3 and the semiconductor chip 15 are located on same surface side of the arm 6 so that the space between magnetic disks 2 is made smaller.

The edge portion 15X1 on the circuit forming surface 15X of the semiconductor chip 15 and the edge portion 15Y1 on the back surface (second main surface) that is opposed to the circuit forming surface 15X are covered with insulative resin. In the present embodiment, the edge portion 15X1 on the circuit forming surface 15X of the semiconductor chip 15 is covered with resin 18 filled between the semiconductor chip 15 and the wiring member 8 so as to cover the circuit forming surface 15X of the semiconductor chip 15. On the other hand, the edge portion 15Y1 on the back surface 15Y side of the semiconductor chip 15 is covered with resin 19 applied so as to cover the back surface 15Y of the semiconductor chip 15. For example, thermosetting resin such as epoxy base resin that is used as the base material containing much non-conductive filler and having the same thermal expansion coefficient as that of the projection electrode 17 is used as the resins 18 and 19. The resin 18 filled between the semiconductor chip 15 and the wiring member 8 functions to disperse the shear stress due to thermal expansion coefficient difference between the semiconductor chip 15 and the wiring member 8, and functions to improve the connection life of the projection electrode 17.

The fabrication process of the semiconductor chip 15 on the arm 6 is by no means limited to the process described hereinafter. In one exemplary process, at first, the projection electrode 17 interposed between the electrode 16 of the semiconductor chip 15 and the wiring 8b of the wiring member 8 is melted to thereby connect the electrode 16 of the semiconductor chip 15 to the wiring 8b of the wiring member 8 electrically and mechanically, and fluid resin 18 is filled between the semiconductor chip 15 and the wiring member 8. Subsequently, the fluid resin 19 is coated so as to cover the back surface 15Y of the semiconductor chip, the resin 19 is cured, and the wiring member 8 is adhered on the arm 6.

The side surface of the semiconductor chip 15 is covered with the resin 18 and the resin 19. In other words, the semiconductor chip 15 of the present embodiment is entirely covered with resin, excepting the electrode part.

Figure 5:
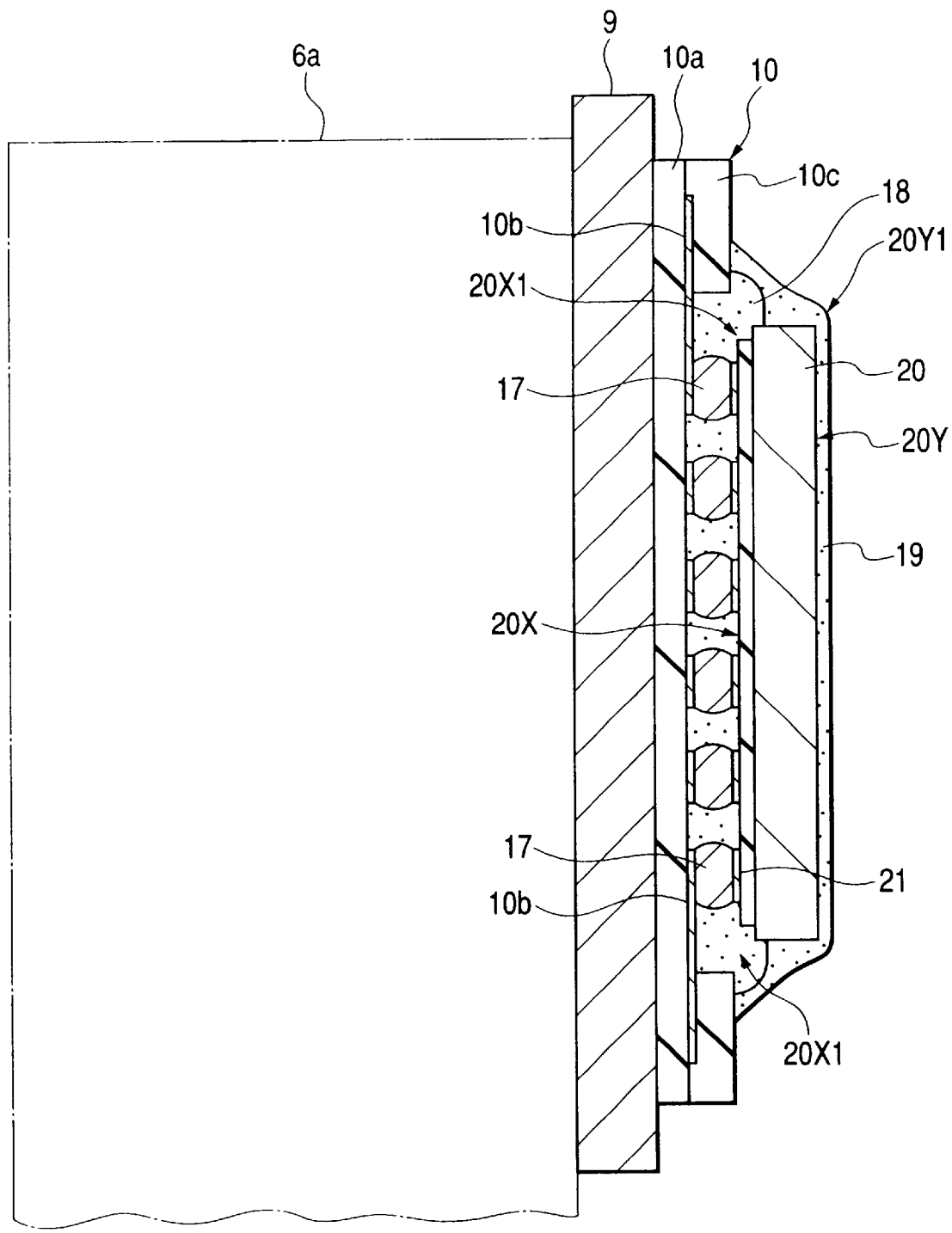
FIG. 5 is a schematic cross sectional view illustrating the schematic structure of a semiconductor chip disposed in the above-mentioned carriage mechanism.

As shown in FIG. 5 (schematic cross sectional view illustrating the schematic structure of the semiconductor chip located on the carriage mechanism) the semiconductor chip 20 mainly comprises the semiconductor substrate formed of, for example, single crystal silicon and the multilayer wiring layer formed on the circuit forming surface of the semiconductor substrate. A plurality of electrodes 21 are formed on the circuit forming surface 20X that is the front surface (first main surface) out of the front and back surfaces (first main surface and second main surface that are opposed to each other) of the semiconductor chip 20.

The semiconductor chip 20 is fixed on the chip location area of the wiring member 10 so that the electrodes 21 formed on the circuit forming surface 20X of the semiconductor chip 20 is facing to the wiring 10b of the wiring member 10. The electrodes 21 of the semiconductor chip 20 are connected electrically and mechanically to the corresponding respective wirings 10b with interposition of projection electrodes 17. In other words, the semiconductor chip 20 of the present embodiment is mounted on the chip location area of the wiring member 10 by means of the face down method.

The chip location area of the wiring member 10 is fixed to a fixing member 9 and the fixing member 9 is fixed to the root part 6a of the arm 6. In other words, the semiconductor chip 20 of the present embodiment is located on the root part 6a of the arm 6 with interposition of the wiring member 10 and the fixing member 9. Herein, the wiring member 10 is formed of flexible wiring member (FPC: Flexible Printed Circuit Board), and comprises an insulation layer 10a, wirings 10b formed on the insulation layer 10a, and an insulation layer 10c formed on the insulation layer 10a so as to cover the wirings 10b.

The side surface of the semiconductor chip 20 is covered with resin 18 and resin 19. In other words, the semiconductor chip 20 of the present embodiment is covered entirely excepting the electrode part like the semiconductor chip 15.

The semiconductor chip 15 shown in FIG. 4 is formed through a process in which a plurality of chip forming areas are formed on the circuit forming surface of a semiconductor wafer (semiconductor substrate) and the semiconductor wafer is diced so that the plurality of chip forming areas are divided into individual areas. In the case of the divided semiconductor chip 15 formed by dicing, many small debris and cracks are formed on the edge portion 15X1 of the circuit forming surface 15X side and the edge portion 15Y1 of the back surface 15Y, but forming of debris from the edge portion 15X1 of the circuit forming surface 15X side of the semiconductor chip 15 and the edge portion 15Y1 of the back surface 15Y is suppressed because the edge portion 15X1 of the circuit forming surface 15X side of the semiconductor chip 15 and the edge portion 15Y1 of the back surface 15Y side are covered with resins (18 and 19).

Furthermore, in the case of the semiconductor chip 20 shown in FIG. 5, because the semiconductor chip 20 is formed in the same manner, though many small debris and cracks are formed on the edge portion 20X1 of the circuit forming surface 20X side and the edge portion 20Y1 of the back surface 20Y side, the forming of debris from the edge portion 20X1 of the circuit forming surface 20X side of the semiconductor chip 20 and the edge portion 20Y1 of the back surface 20Y side is suppressed because the edge portion 20X1 of the circuit forming surface 20X side of the semiconductor chip 20 and the edge portion 20Y1 of the back surface 20Y side are covered with resins (18 and 19).

The edge portion of the back surface side of the semiconductor chips (15 and 20) of the present embodiment is covered with the resin 19 coated so as to cover the back surface of the semiconductor chip. In such case, it is desirable that the resin thickness on the back surface of the semiconductor chip is coated as thin as possible as long as no film break of the resin 19 occurs. The reason is that the heat radiation from the semiconductor chip is maintained as high as possible. Furthermore, in the case of the semiconductor chip 15, the space between magnetic disks 2 is maintained as large as possible.

According to the present embodiment, effects described hereinafter are obtained.

(1) In the case of the semiconductor chip 15 located on the suspension part 6c of the arm 6, the edge portion 15X1 of the circuit forming surface 15X side of the semiconductor chip 15 and the edge portion 15Y1 of the back surface 15Y side are covered with the resins (18 and 19). In the case of the divided semiconductor chip formed by dicing, by applying the structure as described hereinabove, though many small debris and cracks are formed on the edge portion 15X1 of the circuit forming surface 15X side and the edge portion 15Y1 of the back surface 15 side, the forming of debris and cracks from the edge portion 15X1 of the circuit forming surface 15X side of the semiconductor chip 15 and the edge portion 15Y1 of the back surface 15Y side is suppressed because the edge portion 15X1 of the circuit forming surface 15X side of the semiconductor chip 15 and the edge portion 15Y1 of the back surface 15Y side are covered with the resins (18 and 19). As the result, the failure that the recording surface of the magnetic disk 2 and the magnetic head 3 are damaged and the failure in writing of the data and reading out of the data, both failures are caused from the debris interposed between the recording surface of the magnetic disk 2 and a magnetic head 3, are prevented. Further, the failure that the recording surface of the magnetic disk 2 and the magnetic head 3 are damaged and the failure in writing of the data and reading out of the data, both failures being caused by the fact that the magnetic disk rotates at high speed in a closed housing, air flow due to rotation of the magnetic disk 2 blows off debris on the area other than that of the magnetic disk 2, and the debris falls down on the recording surface of the magnetic disk 2 whereby the debris is interposed between the recording surface of the magnetic disk 2 and a magnetic head 3, are suppressed. As the result, the reliability of the magnetic disk apparatus is improved.

(2) In the case of the semiconductor chip 20 located on the root part 6a of the arm 6, the edge portion 20X1 of the circuit forming surface 20X side and the edge portion 20Y1 of the back surface 20Y side of the semiconductor chip 20 are covered with the resins (18 and 19). By using the structure described hereinabove, the same effect as obtained in the case of the semiconductor chip 15 is obtained.

(3) The side surface of the semiconductor chip 15 and the semiconductor chip 20 is covered with the resins (18 and 19). By using the structure described hereinabove, the forming of debris from the edge portion of the circuit forming surfaces (15X and 20X) side and the edge portions of the back surfaces (15Y and 20Y) side of the semiconductor chips (15 and 20) is suppressed the more, and the reliability of the magnetic disk apparatus is improved the more.

The exemplary cases in which thermosetting resin is used as the resins 18 and 19 is described in the present embodiment, but photo-curing resin may be used as the resins 18 and 19. In this case, because heat treatment is not necessary, the wiring member 8 is located on the arm 6 and then the semiconductor chip 15 is mounted on the chip location area of the wiring member 8.

Furthermore, the exemplary case in which the edge portion of the circuit forming surface side of the semiconductor chip is covered with the resin 18 and the edge portion of the back surface side of the semiconductor chip is covered with the resin 19 is described in the present embodiment, but another method may be employed, in which more resin 18 is used so as to go round to the back surface side of the semiconductor chip and the edge portion of the back surface side of the semiconductor chip is covered with the resin. However, because the resin 18 is spread in the plane, this method is disadvantageous in the case that the semiconductor chip is located on a narrow area.

Embodiment 2

Figure 6:
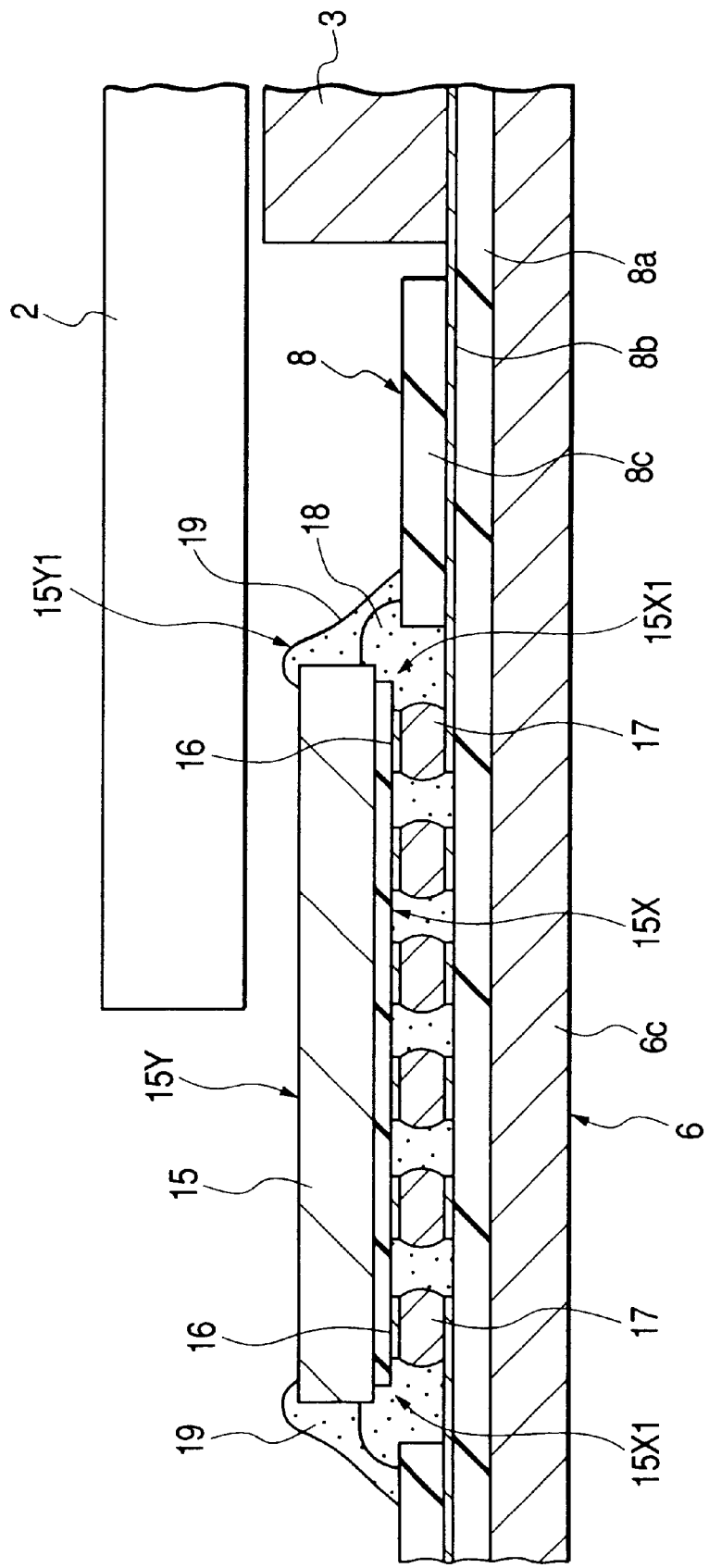
FIG. 6 is a schematic cross sectional view partially illustrating the arm in accordance with the embodiment 2 of the present invention.

FIG. 6 is a schematic cross sectional view partially illustrating an arm in accordance with the embodiment 2 of the present invention.

As shown in FIG. 6, a magnetic disk apparatus of the present embodiment 2 has the same structure as that of the above-mentioned embodiment 1 basically, and is different only in the point described hereinafter.

In detail, the edge portion 15Y1 of the back surface 15Y side of the semiconductor chip 15 is covered with the resin 19, but the central area of the back surface 15Y side of the semiconductor chip 15 is exposed. By using the structure described hereinabove, the same effect as obtained in the case of the above-mentioned embodiment 1 is obtained, and also the heat radiation from the semiconductor chip 15 is improved because the center area of the back surface 15Y side of the semiconductor chip 15 is exposed.

The structure that the central area of the back surface 15Y of the semiconductor chip 15 is exposed and the edge portion 15Y1 of the back surface 15Y side of the semiconductor chip 15 is covered with the resin 19 is achieved by coating the resin 19 along the edge portion 15Y1 of the back surface 15Y side of the semiconductor chip 15.

Embodiment 3

Figure 7:
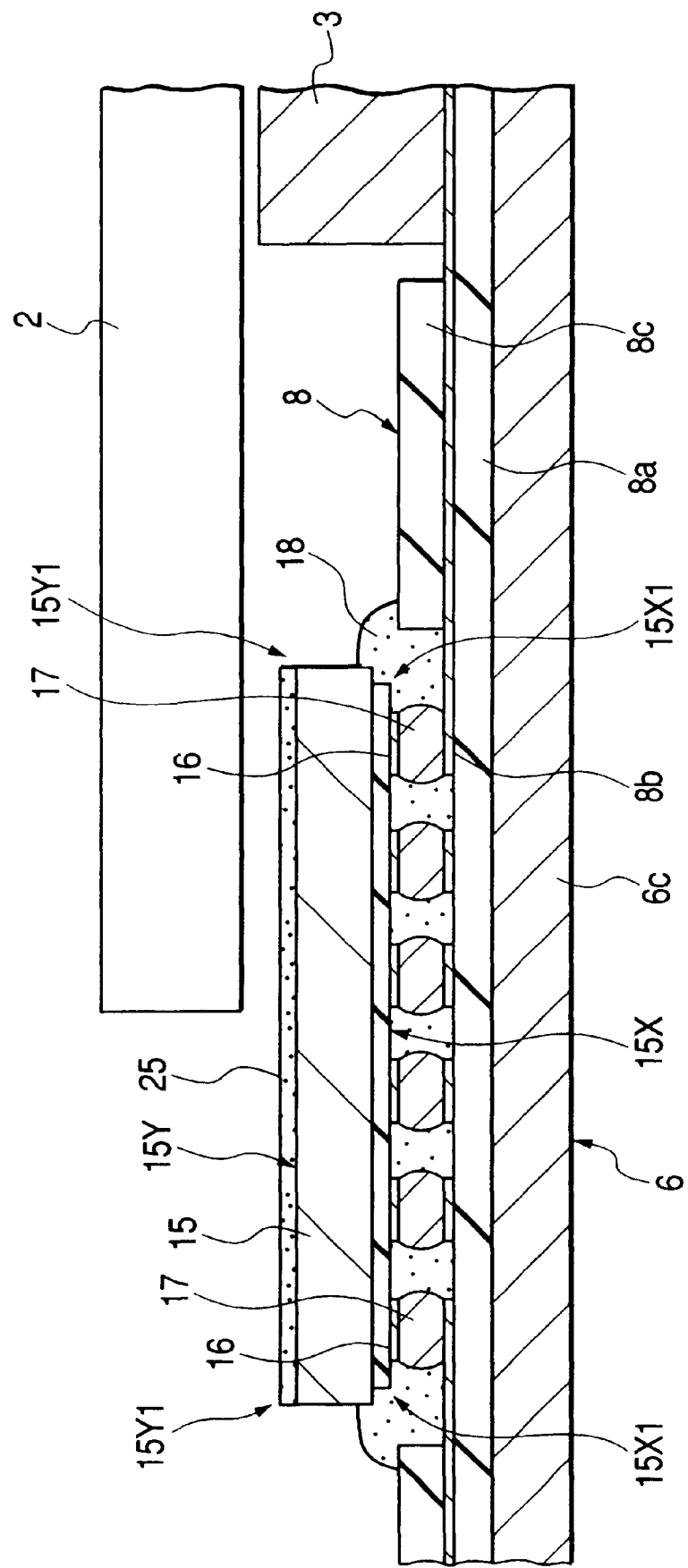
FIG. 7 is a schematic cross sectional view partially illustrating the arm in accordance with the embodiment 3 of the present invention.

FIG. 7 is a schematic cross sectional view partially illustrating an arm in accordance with the embodiment 3 of the present invention.

As shown in FIG. 7, a magnetic disk apparatus of the present embodiment 3 has the same structure as used in the case of the above-mentioned embodiment 1 basically, and the structure is different in the point described hereinafter.

In detail, the edge portion 15Y1 of the back surface 15Y side of the semiconductor chip 15 is covered with resin film 25 located so as to cover the back surface 15 of the semiconductor chip 15. By using the structure described hereinabove, the same effect as obtained in the case of the above-mentioned embodiment 1 is obtained.

The resin film 25 is applied by means of a method in which the resin film 25 is adhered on the back surface of the semiconductor chip after the semiconductor chip is formed by dicing the semiconductor wafer. Otherwise, the resin film 25 may be applied by means of another method in which a resin film is adhered so as to cover the entire back surface of the semiconductor wafer and then the semiconductor wafer and the resin film are diced.

Embodiment 4

Figure 8:
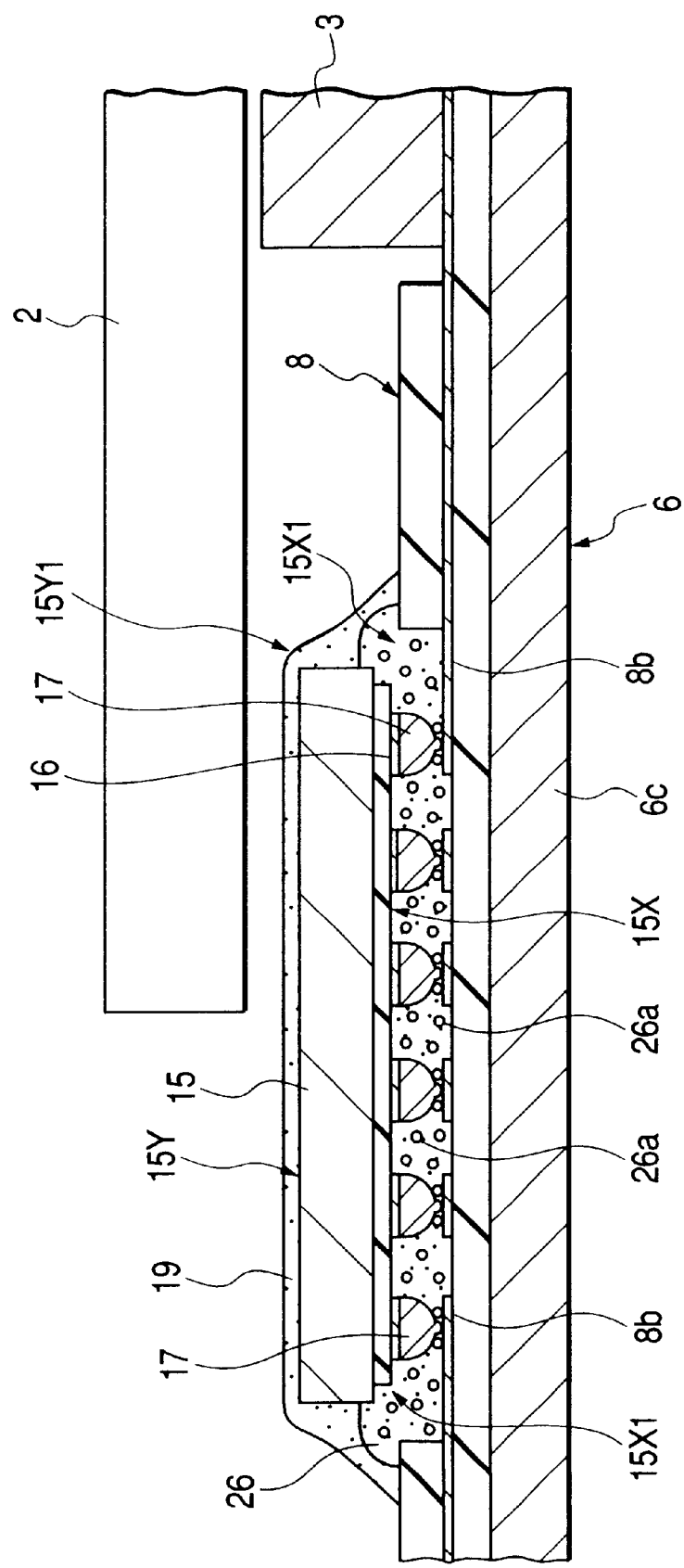
FIG. 8 is a schematic cross sectional view partially illustrating the arm in accordance with the embodiment 4 of the present invention.

FIG. 8 is a schematic cross sectional view partially illustrating an arm in accordance with the embodiment 4 of the present invention.

As shown in FIG. 8, a magnetic disk apparatus of the present embodiment 4 has the same structure as used in the case of the above-mentioned embodiment 1 basically, and the structure is different in the point described hereinafter.

In detail, the semiconductor chip 15 is fixed on the chip location area of the wiring member 8 with interposition of anisotropically conductive resin 26 containing much conductive particles 26a in a resin base material, for example, epoxy base resin. The electrode 16 of the semiconductor chip 15 is electrically connected to the wiring 8b of the wiring member 8 by means of interposition of the projection electrode 17 and by means of interposition of conductive particles 26a mixed in the anisotropically conductive resin 26. An Au bump formed on the electrode 16 of the semiconductor chip 15 by means of ball bonding using, for example, a gold (Au) wire is used as the projection electrode 17. By using the structure described hereinabove, the same effect as obtained in the case of the above-mentioned embodiment 1 is obtained.

Embodiment 5

Figure 9:
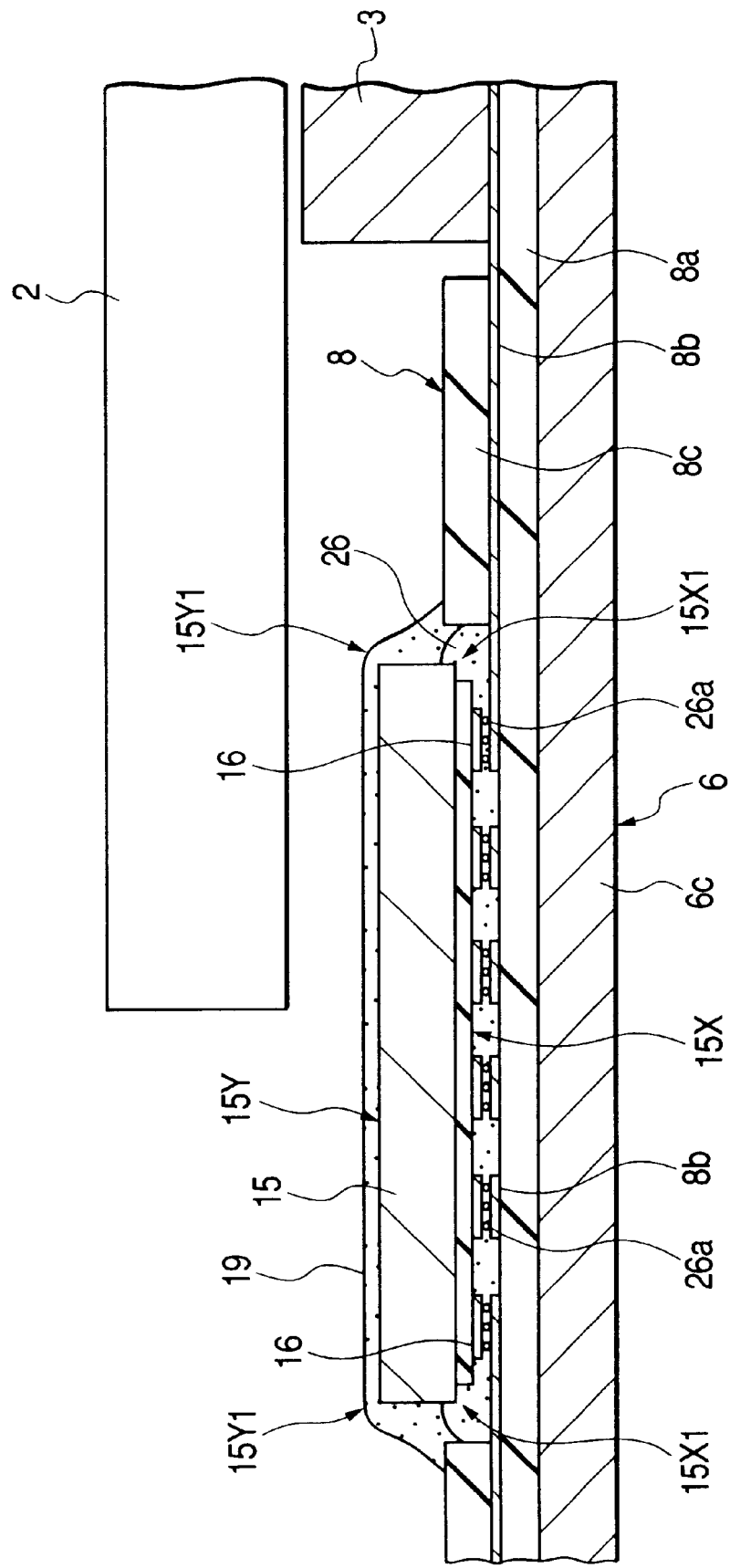
FIG. 9 is a schematic cross sectional view partially illustrating the arm in accordance with the embodiment 5 of the present invention.

FIG. 9 is a schematic cross sectional view partially illustrating an arm in accordance with the embodiment 5 of the present invention.

As shown in FIG. 9, a magnetic disk apparatus of the present embodiment 5 has the same structure as used in the case of the above-mentioned embodiment 4 basically, and the structure is different in the point described hereinafter.

In detail, the semiconductor chip 15 is adhered and fixed on the chip location area of the wiring member 8 with interposition of the anisotropically conductive resin 26. The electrode 16 of the semiconductor chip 15 is electrically connected to the wiring 8b of the wiring member 8 by means of interposition of the conductive particles 26 mixed in the anisotropically conductive resin 26 without the projection electrode. By using the structure described hereinabove, the same effect as obtained in the case of the above-mentioned embodiment 1 is obtained. In comparison with the case of the above-mentioned embodiment 4, because the height of the semiconductor chip that projects upward from the wiring member 8 is reduced by the distance corresponding to the height of the projection electrode, the space between magnetic disks 2 can be narrow, and as the result the magnetic disk apparatus can be made thin.

Embodiment 6

Figure 10:
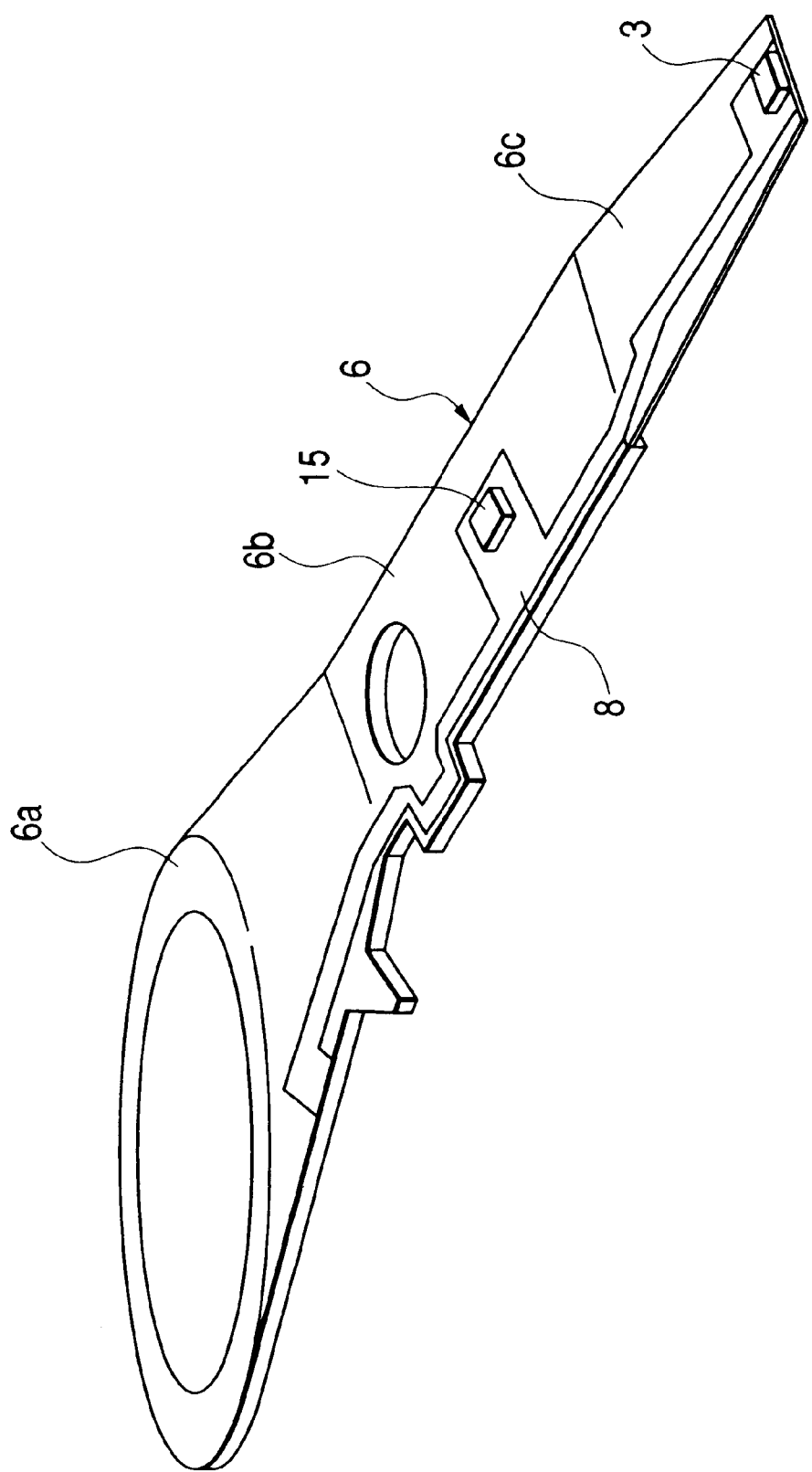
FIG. 10 is a schematic perspective view of an arm in accordance with the embodiment 6 of the present invention.
Figure 11:
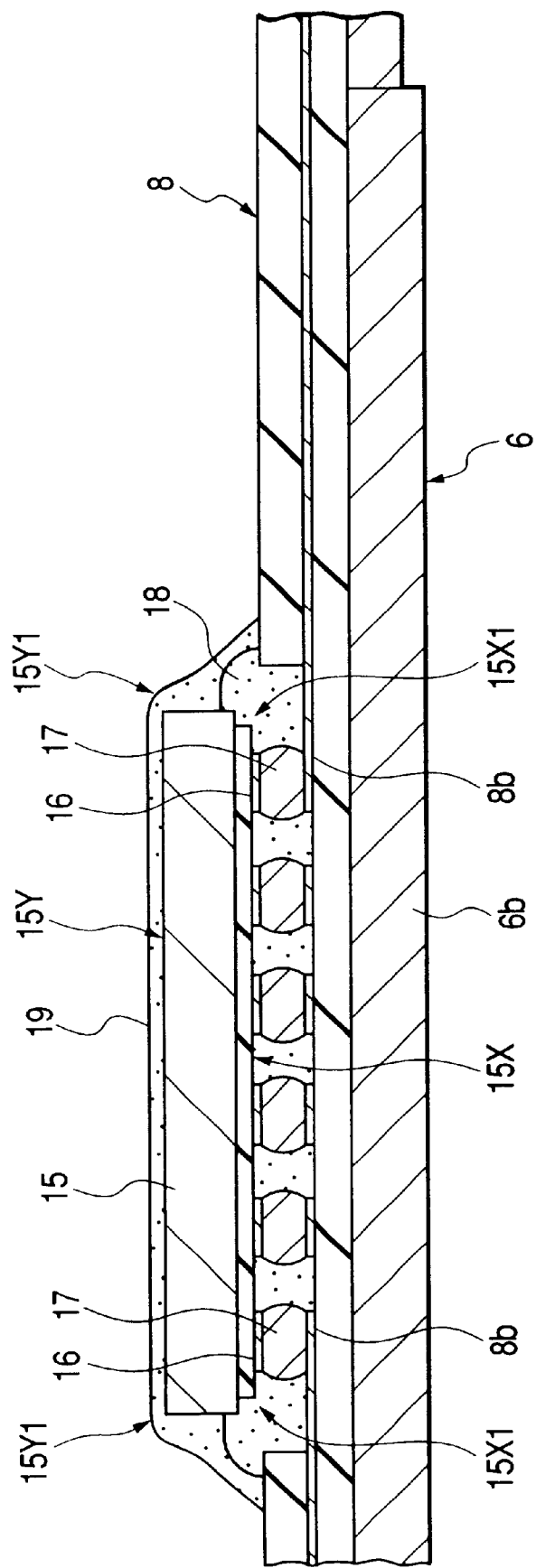
FIG. 11 is a partially enlarged schematic cross sectional view of FIG. 10.

FIG. 10 is a schematic perspective view of an arm in accordance with the embodiment 5 of the present invention, and FIG. 11 is a partially enlarged schematic cross sectional view of the arm in accordance with the embodiment 5 of the present invention.

As shown in FIG. 10 and FIG. 11, the magnetic disk apparatus of the present embodiment 6 has the same structure as used in the case of the above-mentioned embodiment 1 basically, and the structure is different in the point described hereinafter.

In detail, the semiconductor chip 15 is located on the arm body part 6b of the arm 6. By using the structure described hereinabove, the same effect as obtained in the case of the above-mentioned embodiment 1 is obtained.

Embodiment 7

Figure 12:
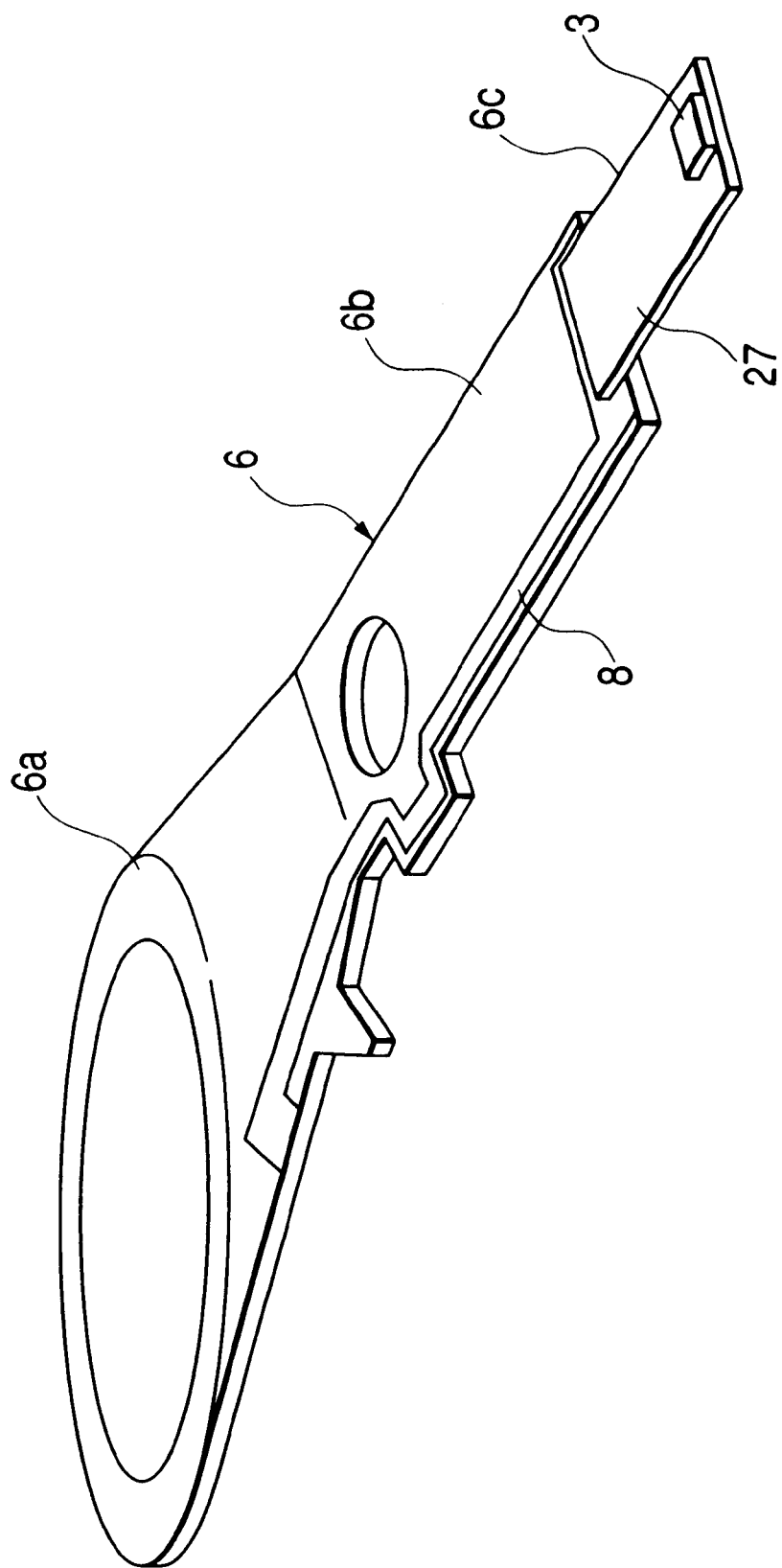
FIG. 12 is a schematic perspective view of an arm in accordance with the embodiment 7 of the present invention.
Figure 13:
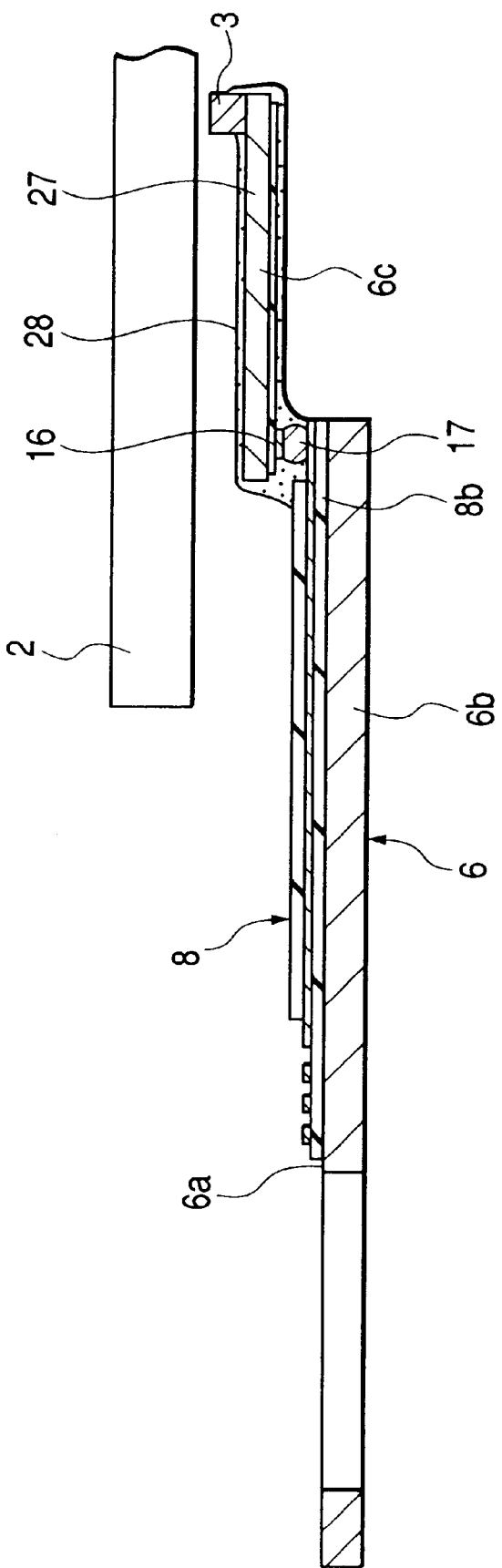
FIG. 13 is a partially enlarged schematic cross sectional view of FIG. 12.

FIG. 12 is a schematic perspective view of an arm in accordance with the embodiment 7 of the present invention, and FIG. 13 is a partially enlarged schematic cross sectional view of FIG. 12.

As shown in FIG. 12 and FIG. 13, a magnetic disk apparatus of the present embodiment 7 has the same structure as used in the case of the above-mentioned embodiment 1 basically, and the structure is different in the point described hereinafter.

In detail, the suspension part 6c of the arm 6 comprises the semiconductor chip 27 mainly formed of a silicon substrate. The electrode 16 of the semiconductor chip 27 is electrically and mechanically connected to the wiring 8b of the wiring member 8 with interposition of the projection electrode 17. The semiconductor chip 27 has the same built-in circuit as the semiconductor chip 15 of the above-mentioned embodiment 1. The edge portion of circuit forming surface side of the semiconductor chip 27 and the edge portion of the back surface side are covered with resin 28 coated so as to cover the semiconductor chip 27. The magnetic head 3 is located on the back surface side of the semiconductor chip 27. By using the structure described hereinabove, the same effect as obtained in the case of the above-mentioned embodiment 1 is obtained.

The invention achieved by the inventors of the present invention is described in detail based on the above-mentioned embodiments, but the present invention is by no means limited by the above-mentioned embodiments, and may be modified variously without departing from the spirit and the scope of the present invention.

For example, the present invention may be applied to a magnetic disk apparatus that is to be incorporated in a personal computer or the like as a memory apparatus.

Furthermore, the present invention may be applied to a card-type magnetic disk apparatus that is to be connected to a memory unit of a personal computer or the like as an expansion memory unit.

Furthermore, an exemplary case in which the present invention is applied to a semiconductor chip located on the carriage mechanism 4 is described in the above-mentioned embodiments, but the present invention may be applied to a semiconductor chip located in the place other than the carriage mechanism 4 in the housing 12.

The effect obtained by applying the representative inventions out of the inventions disclosed in the present patent application is described briefly hereinafter.

According to the present invention, the reliability of a magnetic disk apparatus is improved.

What is claimed is:

1. A magnetic disk apparatus comprising:
    a disk-shaped magnetic recording medium that rotates in operation,
    a magnetic head for writing data in the magnetic recording medium and for reading out data written in the magnetic recording medium,
    a carriage mechanism having an arm on which the magnetic head is located and moving the magnetic head to an arbitrary position of the magnetic recording medium,
    a wiring member having an insulator and a wiring formed on the insulator;
    a semiconductor chip having a first main surface and a second main surface that are opposed to each other, an electrode formed on the first main surface and a projection electrode formed on the electrode, the semiconductor chip being fixed to the insulator in a state that the first main surface is facing to the insulator, and
    a housing that contains the magnetic recording medium, the magnetic head, the carriage mechanism, the insulator, the wiring and the semiconductor chip,
    wherein:
        the electrode of the semiconductor chip is electrically connected to the wiring with interposition of the projection electrode,
        an edge of the first main surface of the semiconductor chip is covered with a first resin filled between the first main surface of the semiconductor chip and the insulator,
        the entirety of the second main surface of the semiconductor chip, an edge of the second main surface of the semiconductor chip, and the entirety of a portion of the semiconductor chip exposed from the first resin on a side of the semiconductor chip, are covered with a second resin, and
        wherein a first portion of the second resin covering the second main surface of the semiconductor chip, a second portion of the second resin covering the edge of the second main surface of the semiconductor chip, and a third portion of the second resin covering the side of the semiconductor chip, are formed in a body.

2. The magnetic disk apparatus according to claim 1, wherein;
    the arm comprises a root part to which the magnetic head moving force of the carriage mechanism is transmitted, an arm body part that is continuous to the root part, and a suspension part that is continuous to the arm body part and on which the magnetic head is located, and
    the semiconductor chip is located on the suspension part of the arm with interposition of the wiring member.

3. The magnetic disk apparatus according to claim 1, wherein;
    the arm comprises a root part to which the magnetic head moving force of the carriage mechanism is transmitted, an arm body part that is continuous to the root part, and a suspension part that is continuous to the arm body part and on which the magnetic head is located, and
    the semiconductor chip is located on the arm body part of the arm with interposition of the wiring member.

4. The magnetic disk apparatus according to claim 1, wherein;
the arm comprises a root part to which the magnetic head moving force of the carriage mechanism is transmitted, an arm body part that is continuous to the root part, and a suspension part that is continuous to the arm body part and on which the magnetic head is located, and
the semiconductor chip is located on the root part of the arm with interposition of the wiring member.

5. The magnetic disk apparatus according to claim 1, wherein the projection electrode comprises a solder bump.

6. The magnetic disk apparatus according to claim 1, wherein the projection electrode comprises an Au bump.

7. The magnetic disk apparatus according to claim 1, wherein the semiconductor chip comprises a semiconductor substrate formed of crystal silicon.

8. The magnetic disk apparatus according to claim 1, wherein the semiconductor chip has an edge cut by a dicing method.

9. The magnetic disk apparatus according to claim 1, wherein the semiconductor chip has an amplifier circuit formed on the first main surface, for amplifying a signal read out using the magnetic head.

10. A magnetic disk apparatus according to claim 1, wherein the wiring member is comprised of flexible wiring components.

11. A magnetic disk apparatus according to claim 1, wherein the first portion, the second portion and the third portion of the second resin are made of the same material.

12. A magnetic disk apparatus comprising:
a disk-shaped magnetic recording medium that rotates in operation,
a magnetic head for writing data in the magnetic recording medium and for reading out data written in the magnetic recording medium,
a carriage mechanism having an arm on which the magnetic head is located and moving the magnetic head to an arbitrary position on the magnetic recording medium,
a wiring member having an insulator and a wiring formed on the insulator,
a semiconductor chip having a first main surface and a second main surface that are opposed to each other, an amplifier circuit formed on the first main surface, for amplifying a signal read out using the magnetic head, an electrode formed on the first main surface and a projection electrode formed on the electrode, the semiconductor chip being fixed to the insulator in a state that the first main surface is facing to the insulator, and
a housing that contains the magnetic recording medium, the magnetic head, the carriage mechanism, the insulator, the wiring and the semiconductor chip, wherein:
the semiconductor chip is adhered and fixed to the insulator with interposition of an anisotropically conductive resin containing conductive particles mixed in an insulative resin base material,
the electrode of the semiconductor chip is electrically connected to the wiring with interposition of the projection electrode and the conductive particles contained in the anisotropically conductive resin,
an edge of the first main surface of the semiconductor chip is covered with the anisotropically conductive resin,
the entirety of the second main surface of the semiconductor chip, an edge of the second main surface of the semiconductor chip, and the entirety of a portion of the semiconductor chip exposed from the first resin on a side of the semiconductor chip, are covered with a second resin, and
wherein a first portion of the second resin covering the second main surface of the semiconductor chip, a second portion of the second resin covering the edge of the second main surface of the semiconductor chip, and a third portion of the second resin covering the side of the semiconductor chip, are formed in a body.

13. A magnetic disk apparatus comprising:
a disk-shaped magnetic recording medium that rotates in operation,
a magnetic head for writing data in the magnetic recording medium and for reading out data written in the magnetic recording medium,
a carriage mechanism having an arm on which the magnetic head is located and moving the magnetic head to an arbitrary position on the magnetic recording medium,
a wiring member having an insulator and a wiring formed on the insulator,
a semiconductor chip having a first main surface and a second main surface that are opposed to each other, an amplifier circuit formed on the first main surface, for amplifying a signal read out using the magnetic head, and an electrode formed on the first main surface, the semiconductor chip being fixed to the insulator in a state that the first main surface is facing to the insulator, and
a housing that contains the magnetic recording medium, the magnetic head, the carriage mechanism, the insulator, the wiring and the semiconductor chip, wherein:
the semiconductor chip is adhered and fixed to the insulator with interposition of an anisotropically conductive resin containing conductive particles mixed in an insulative resin base material,
the electrode of the semiconductor chip is electrically connected to the wiring with interposition of the conductive particles contained in the anisotropically conductive resin,
the entirety of the second main surface of the semiconductor chip, an edge of the second main surface of the semiconductor chip, and the entirety of a portion of the semiconductor chip exposed from the first resin on a side of the semiconductor chip, are covered with a second resin, and
wherein a first portion of the second resin covering the second main surface of the semiconductor chip, a second portion of the second resin covering the edge of the second main surface of the semiconductor chip, and a third portion of the second resin covering the side of the semiconductor chip, are formed in a body.

14. A magnetic disk apparatus comprising:
a disk-shaped magnetic recording medium that rotates in operation;
a magnetic head for writing data in the magnetic recording medium and for reading out data written in the magnetic recording medium;
a carriage mechanism having an arm on which the magnetic head is located and moving the magnetic head to an arbitrary position of the magnetic recording medium;

a wiring member having an insulation layer and wirings, wherein the insulation layer has a first main surface and a second main surface opposed to each other, the wirings being formed on the first main surface of the insulation layer;

a semiconductor chip having a first main surface and a second main surface that are opposed to each other, and a plurality of projection electrodes formed on the first main surface thereof, wherein the semiconductor chip is fixed on the first main surface of the insulation layer in a state that the first main surface of the semiconductor chip faces the first main surface of the insulation layer, and the semiconductor chip being is electrically connected with the magnetic head via the projection electrodes and the wiring member;

a housing that contains the magnetic recording medium, the magnetic head, the carriage mechanism, the wiring member and the semiconductor chip;

a first resin filling between the first main surface of the semiconductor chip and the first main surface of the insulation layer; and a second resin covering the entirety of the second main surface of the semiconductor chip, an edge of the second main surface of the semiconductor chip, and the entirety of a portion of the semiconductor chip exposed from the first resin on a side of the semiconductor chip;

wherein a first portion of the second resin covering the second main surface of the semiconductor chip, a second portion of the second resin covering the edge of the second main surface of the semiconductor chip, and a third portion of the second resin covering the side of the semiconductor chip, are formed in a body.

15. A magnetic disk apparatus according to claim 14, wherein the semiconductor chip further has an amplifier circuit formed on the first main surface thereof for amplifying a signal read out using the magnetic head.

16. A magnetic disk apparatus according to claim 14, wherein each of the plurality of projection electrodes comprises a solder bump.

17. A magnetic disk apparatus according to claim 14, wherein each of the plurality of projection electrodes comprises an Au bump.

18. A magnetic disk apparatus according to claim 14, wherein the semiconductor chip has an edge cut by a dicing method.

19. A magnetic disk apparatus according to claim 14, wherein the semiconductor chip comprises a semiconductor substrate formed of crystal silicon.

20. A magnetic disk apparatus comprising:

a disk-shaped magnetic recording medium that rotates in operation, a magnetic head for writing data in the magnetic recording medium and for reading out data written in the magnetic recording medium, a carriage mechanism having an arm on which the magnetic head is located and moving the magnetic head to an arbitrary position of the magnetic recording medium, a wiring member having an insulator and a wiring formed on the insulator, a semiconductor chip having a first main surface and a second main surface that are opposed to each other, an electrode formed on the first main surface and a projection electrode formed on the electrode, the semiconductor chip being fixed to the insulator in a state that the first main surface is facing to the insulator, and a housing that contains the magnetic recording medium, the magnetic head, the carriage mechanism, the insulator, the wiring and the semiconductor chip, wherein:

the electrode of the semiconductor chip is electrically connected to the wiring via the projection electrode, and the first main surface of the semiconductor chip, an edge of the first main surface of the semiconductor chip, the entirety of the second main surface of the semiconductor chip, an edge of the second main surface of the semiconductor chip, and the entirety of a side of the semiconductor chip are covered with a resin.

21. A magnetic disk apparatus comprising:

a disk-shaped magnetic recording medium that rotates in operation, a magnetic head for writing data in the magnetic recording medium and for reading out data written in the magnetic recording medium, a carriage mechanism having an arm on which the magnetic head is located and moving the magnetic head to an arbitrary position of the magnetic recording medium, a wiring member having an insulator and a wiring formed on the insulator, a semiconductor chip having a first main surface and a second main surface that are opposed to each other, an electrode formed on the first main surface and a projection electrode formed on the electrode, the semiconductor chip being fixed to the insulator in a state that the first main surface is facing to the insulator, and a housing that contains the magnetic recording medium, the magnetic head, the carriage mechanism, the insulator, the wiring and the semiconductor chip, wherein:

the electrode of the semiconductor chip is electrically connected to the wiring via the projection electrode, and the entire surface of the semiconductor chip is covered with a resin.

22. A method of manufacturing a magnetic disk apparatus comprising the steps of:

providing a semiconductor chip having a first main surface and a second main surface that are opposed to each other, an electrode formed on the first main surface and a projection electrode formed on the electrode, providing a wiring member having a first insulator, and a wiring formed on the first insulator, and a second insulator formed on the first insulator covering the wiring, electrically connecting the electrode of the semiconductor chip to the wiring via the projection electrode, the semiconductor chip being fixed to the first insulator in a state that the first main surface is facing to the first insulator, and filling, with a first resin, space between the semiconductor chip and the wiring member, and covering with the first resin an edge of the first main surface of the semiconductor chip, covering, with a fluid resin, the entirety of the second main surface of the semiconductor chip, an edge of the second main surface of the semiconductor chip, and the entirety of a portion of the semiconductor chip exposed from the first resin on a side of the semiconductor chip, and after the covering step, curing the fluid resin applied to the second main surface of the semiconductor chip, the edge of the second main surface of the semiconductor chip, and the side of the semiconductor chip, and forming a second resin with the cured resin which covers the second main surface of the semiconductor chip, the edge of the second main surface of the semiconductor chip, and the side of the semiconductor chip in a body.

* * * * *